(12) United States Patent
Sugimoto et al.

(10) Patent No.: US 10,774,435 B2
(45) Date of Patent: Sep. 15, 2020

(54) WIRED CIRCUIT BOARD AND PRODUCTION METHOD THEREOF

(71) Applicant: NITTO DENKO CORPORATION, Osaka (JP)

(72) Inventors: Yuu Sugimoto, Osaka (JP); Hiroyuki Tanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/479,071

(22) PCT Filed: Jan. 22, 2018

(86) PCT No.: PCT/JP2018/001759
§ 371 (c)(1),
(2) Date: Jul. 18, 2019

(87) PCT Pub. No.: WO2018/135655
PCT Pub. Date: Jul. 26, 2018

(65) Prior Publication Data
US 2019/0394882 A1     Dec. 26, 2019

(30) Foreign Application Priority Data

Jan. 23, 2017  (JP) .................. 2017-009187

(51) Int. Cl.
*H05K 1/05*     (2006.01)
*G11B 5/48*     (2006.01)
(Continued)

(52) U.S. Cl.
CPC .................. *C25D 5/02* (2013.01); *C25D 3/48* (2013.01); *C25D 5/022* (2013.01); *C25D 5/10* (2013.01);
(Continued)

(58) Field of Classification Search
CPC . C25D 5/02; C25D 5/022; C25D 5/50; C25D 3/48; C25D 7/00; C25D 5/36;
(Continued)

(56) References Cited

U.S. PATENT DOCUMENTS 2,133,995 A * 10/1938 Lukens .................. C25D 3/48
205/170
2011/0128033 A1   6/2011 Ohsawa et al.
(Continued)

FOREIGN PATENT DOCUMENTS

JP    H07-296354 A    11/1995
JP    2009-283501 A   12/2009
(Continued)

OTHER PUBLICATIONS

International Preliminary Report on Patentability issued by WIPO dated Jul. 23, 2019, in connection with International Patent Application No. PCT/JP2018/001759.
(Continued)

*Primary Examiner* — Ishwarbhai B Patel
(74) *Attorney, Agent, or Firm* — Jean C. Edwards, Esq.; Edwards Neils LLC (57) ABSTRACT

The wired circuit board includes a metal supporting board, an insulating layer and a conductor layer disposed at one side in the thickness direction of the metal supporting board, a gold plate layer disposed at the other side in the thickness direction of the metal supporting board, and an adherence layer disposed between the metal supporting board and the gold plate layer. The material of the metal supporting board is a corrosion resistant alloy. In the adherence layer, gold and the metal contained in the corrosion resistant alloy are mixedly present.

6 Claims, 2 Drawing Sheets

(51) Int. Cl.
*C25D 5/02* (2006.01)
*C25D 7/00* (2006.01)
*C25D 3/48* (2006.01)
*C25D 5/50* (2006.01)
*H05K 3/24* (2006.01)
*C25D 5/10* (2006.01)
*C25D 5/36* (2006.01)
*H05K 3/18* (2006.01)
*H05K 3/46* (2006.01)
*H05K 1/03* (2006.01)
*H05K 1/11* (2006.01)
*H05K 1/02* (2006.01)

(52) U.S. Cl.
CPC .............. *C25D 5/36* (2013.01); *C25D 5/50* (2013.01); *C25D 7/00* (2013.01); *H05K 1/05* (2013.01); *H05K 3/188* (2013.01); *H05K 3/241* (2013.01); *H05K 3/243* (2013.01); *H05K 3/4644* (2013.01); *G11B 5/4833* (2013.01); *H05K 1/0281* (2013.01); *H05K 1/0393* (2013.01); *H05K 1/053* (2013.01); *H05K 1/056* (2013.01); *H05K 1/11* (2013.01); *H05K 2203/1105* (2013.01); *H05K 2203/1476* (2013.01)

(58) Field of Classification Search
CPC .......... C25D 5/10; H05K 3/241; H05K 3/243; H05K 1/05; H05K 3/4644; H05K 3/188; H05K 2203/1105; H05K 2203/1476; H05K 1/053; H05K 1/056; G11B 5/4833
See application file for complete search history.

(56) References Cited

U.S. PATENT DOCUMENTS

| | | | |
|---|---|---|---|
| 2012/0113547 A1* | 5/2012 | Sugimoto | G11B 5/486 360/245.8 |
| 2013/0314821 A1 | 11/2013 | Arai | |
| 2014/0311776 A1* | 10/2014 | Takakura | H05K 1/056 174/255 |
| 2014/0345920 A1* | 11/2014 | Ihara | H05K 3/3405 174/257 |
| 2016/0234936 A1 | 8/2016 | Okuno et al. | |
| 2016/0340786 A1 | 11/2016 | Mukai et al. | |

FOREIGN PATENT DOCUMENTS

| | | |
|---|---|---|
| JP | 2011-118966 A | 6/2011 |
| JP | 2012-104189 A | 5/2012 |
| JP | 2013-246840 A | 12/2013 |
| JP | 2016-009514 A | 1/2016 |
| JP | 2016-018576 A | 2/2016 |
| JP | 2016-103305 A | 6/2016 |
| JP | 2017-162540 A | 9/2017 |
| WO | 2015/041132 A1 | 3/2015 |

OTHER PUBLICATIONS

International Search Report Issued in PCT/JP2018/001759 dated Apr. 24, 2018.

* cited by examiner

WIRED CIRCUIT BOARD AND PRODUCTION METHOD THEREOF

CROSS-REFERENCE TO RELATED APPLICATIONS

The present application is a 35 U.S.C. 371 National Stage Entry of PCT/JP2018/001759, filed on Jan. 22, 2018, which claims priority from Japanese Patent Application No. 2017-009187, filed on Jan. 23, 2017, the contents of all of which are herein incorporated by reference in their entirety.

TECHNICAL FIELD

The present invention relates to a wired circuit board and a production method thereof.

BACKGROUND ART

It has been known that a wired circuit board such as a suspension board with circuit includes a metal supporting board composed of stainless steel and including terminals; an insulating layer disposed thereon; a conductor pattern disposed thereon; and a gold plate layer disposed below the terminals (for example, see Patent Document 1 below).

In Patent Document 1, a conductive layer including a copper layer is further disposed between the terminal and gold plate layer, and with the conductive layer, adherence between the terminal and gold plate layer is improved.

CITATION LIST

Patent Document

Patent Document 1: Japanese Unexamined Patent Publication No. 2012-104189

SUMMARY OF THE INVENTION

Problem to be Solved by the Invention

However, the metal supporting board in the wired circuit board has to exhibit long-term durability, and therefore excellent anticorrosion properties is required for the conductive layer.

However, in the conductive layer of Patent Document 1, the copper layer is easily corroded. Therefore, there are disadvantages in that the above-described requirements cannot be satisfied. Meanwhile, adherence between the metal supporting board and gold plate layer is also required.

The present invention provides a wired circuit board including an adherence layer with excellent anticorrosion, and that allows for improvement in adherence between the metal supporting board and gold plate layer.

Means for Solving the Problem

The present invention (1) includes a wired circuit board including a metal supporting board, an insulating layer disposed at one side in the thickness direction of the metal supporting board, a conductor layer disposed at one side in the thickness direction of the insulating layer, a gold plate layer disposed at the other side in the thickness direction of the metal supporting board, and an adherence layer disposed between the metal supporting board and gold plate layer, wherein the material of the metal supporting board is a corrosion resistant alloy, and in the adherence layer, gold and the metals contained in the corrosion resistant alloy are mixedly present.

The present invention (2) includes the wired circuit board described in (1), wherein the adherence layer has a thickness of 2 nm or more.

The present invention (3) includes the wired circuit board described in (1) or (2), wherein the adherence layer includes a first layer adjacent to the metal supporting board, and a second layer adjacent to the gold plate layer; in the first layer, the percentage of gold atom is higher than the percentage of metal atom, and in the second layer, the percentage of gold atom is lower than the percentage of metal atom.

The present invention (4) includes the wired circuit board described in any one of (1) to (3), wherein the corrosion resistant alloy is stainless steel, and the metal is chromium.

The present invention (5) includes the wired circuit board described in any one of (1) to (4), wherein the metal supporting board includes a terminal portion, and the adherence layer and the gold plate layer are disposed in sequence at the other side in the thickness direction of the terminal portion.

The present invention (6) includes the wired circuit board described in (1), being a suspension board with circuit.

The present invention (7) includes a method for producing a wired circuit board, the method including the steps of: a step of preparing a wired circuit board including a metal supporting board, an insulating layer disposed at one side in the thickness direction of the metal supporting board, a conductor layer disposed at one side in the thickness direction of the insulating layer, a gold plate layer disposed at the other side in the thickness direction of the metal supporting board, and an adherence layer disposed between the metal supporting board and the gold plate layer; and a step of forming an adherence layer disposed between the metal supporting board and the gold plate layer by heating the metal supporting board and the gold plate layer, wherein the material of the metal supporting board is corrosion resistant alloy, and in the adherence layer, gold and the metal contained in the corrosion resistant alloy are mixedly present.

The present invention (8) includes a method for producing a wired circuit board described in (7), wherein in the step of forming the adherence layer, the metal supporting board and the gold plate layer are heated at 200° C. or more.

Effects of the Invention

In the wired circuit board of the present invention, in the adherence layer, gold and the metal contained in the corrosion resistant alloy are mixedly present. Therefore, the adherence layer has excellent anticorrosion.

Furthermore, the above-described adherence layer is disposed between the metal supporting board and the gold plate layer, and therefore the adherence layer can improve adherence between the metal supporting board and the gold plate layer.

As a result, the wired circuit board has excellent durability.

With the method for producing a wired circuit board of the present invention, the adherence layer in which gold and the metal contained in the corrosion resistant alloy are mixedly present can be formed by heating the metal supporting board and the gold plate layer, and therefore an adherence layer having excellent anticorrosion properties and allows for improvement in adherence of the metal supporting board and the gold plate layer can be easily formed.

BRIEF DESCRIPTION OF THE DRAWINGS

FIG. 1 A to FIG. 1 C are process diagrams illustrating production of a suspension board with circuit as an embodiment of the wired circuit board of the present invention, FIG. 1 A is a first step, in which the suspension board with circuit is prepared, FIG. 1 B is a second step, in which a gold plate layer is disposed, and FIG. 1 C is a third step, in which an adherence layer is formed.

FIG. 2 A and FIG. 2 B are processed TEM images of the terminal and the gold plate layer of Example 1, FIG. 2 A is a processed TEM image of the terminal and the gold plate layer after the second step and before the third step, FIG. 2 B is a processed TEM image of the terminal, adherence layer, and gold plate layer after the third step.

DESCRIPTION OF THE EMBODIMENTS

Figure 1A:
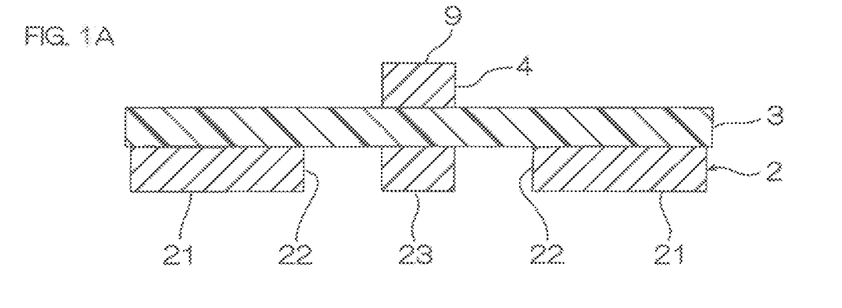
Figure 1B:
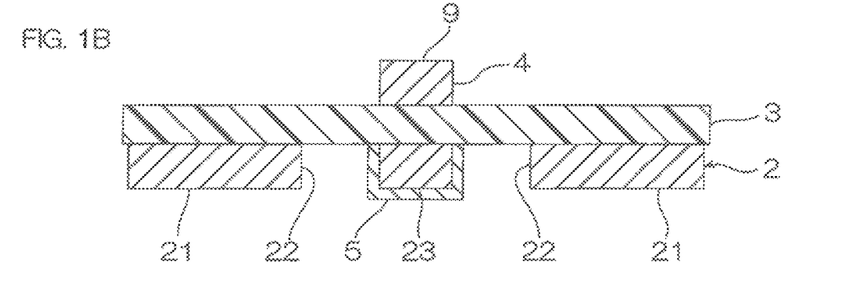
Figure 1C:
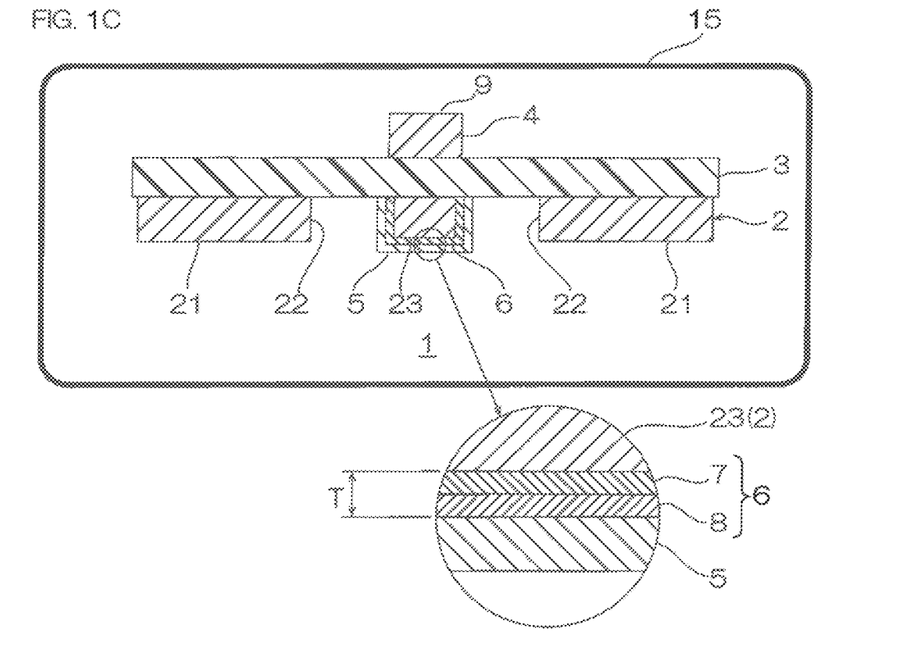
Figure 2A:
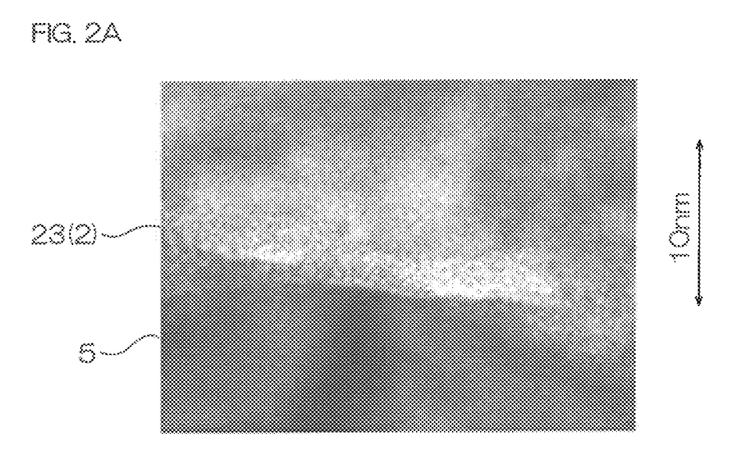
Figure 2B:
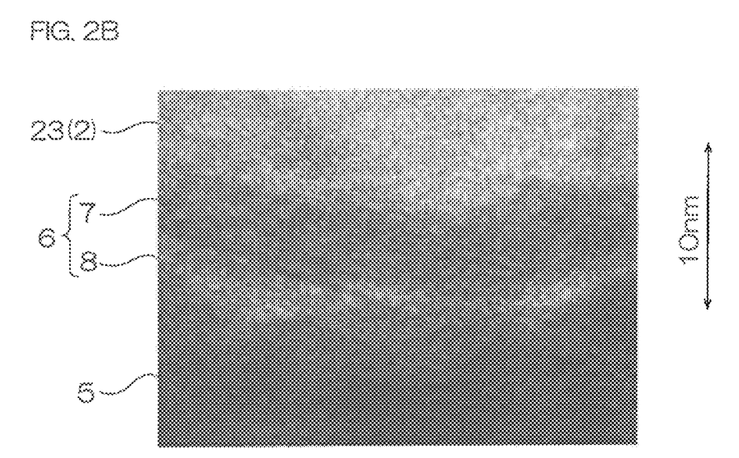

With reference FIG. 1C, a suspension board with circuit 1 as an embodiment of the wired circuit board of the present invention is described.

The suspension board with circuit 1 is used, for example, for a hard disk drive in which an optical assist system is used, after mounted with a slider/light source unit having a slider (not shown) on which a magnetic head (not shown) is mounted, and a light source (not shown) such as laser diode (optical element). The suspension board with circuit 1 includes a metal supporting board 2, an insulating base layer 3 as an example of the insulating layer, a conductor layer 4, an insulating cover layer (not shown), a gold plate layer 5, and an adherence layer 6.

The metal supporting board 2 has a substantially flat plate (sheet) shape extending in a surface direction orthogonal to the thickness direction. The metal supporting board 2 is a support member that gives tenacity to the suspension board with circuit 1. The metal supporting board 2 has a main body portion 21, an opening 22, and a terminal portion 23.

The outline shape of the main body portion 21 is the same as the outline shape of the suspension board with circuit 1.

The opening 22 is formed at an inner side of the main body portion 21, and penetrates the metal supporting board 2 in the thickness direction. The main body portion 21 surrounding the opening 22 has substantially a frame shape when viewed from the bottom (not shown).

The terminal portion 23 serves for electrical connection with a light source, which is not shown. In this case, the terminal portion 23 is electrically connected with the light source (not shown) disposed at the other side in the thickness direction of the terminal portion 23 through the adherence layer 6 (described later) and the gold plate layer 5 (described later). The connection between the terminal portion 23 and the light source is described, for example, in Japanese Unexamined Patent Publication No. 2017-162540, Japanese Unexamined Patent Publication No. 2016-103305, Japanese Unexamined Patent Publication No. 2016-018576, and Japanese Unexamined Patent Publication No. 2016-009514.

Alternatively, the terminal portion 23 can be temporarily electrically connected with a terminal (probe, etc.) (not shown) of a detection device (thereafter disconnected). The connection between the terminal portion 23 and the detection device is described, for example, in Japanese Unexamined Patent Publication No. 2012-104189.

The terminal portion 23 is disposed inside the opening 22. The outer end edge (peripheral end edge) of the terminal portion 23 is disposed with a space provided therebetween at an inner side from the inner end edge of the main body portion 21 in the surface direction (direction orthogonal to the thickness direction). The terminal portion 23 is insulated from the main body portion 21 in this manner.

The material of the metal supporting board 2 is a corrosion resistant alloy. Examples of the corrosion resistant alloy include stainless steel, nickel alloy, and aluminum alloy, and preferably, in view of obtaining more excellent anticorrosion, stainless steel is used. The corrosion resistant alloy preferably contains no gold, in view of forming the adherence layer 6 to be described later, in which it is mixedly present with gold of the gold plate layer 5.

Stainless steel contains iron as a basic component, and furthermore, contains chromium as an essential component, and nickel and molybdenum as an optional component.

The chromium content in stainless steel is, for example, 10 mass % or more, preferably 18 mass % or more, and for example, 30 mass % or less, preferably 20 mass % or less.

For the stainless steel, based on AISI (American Iron and Steel Institute) standard, for example, SUS301, SUS304, SUS305, SUS309, SUS310, SUS316, SUS317, SUS321, and SUS347 are used.

The corrosion resistant alloy can be used singly, or can be used in combination of two or more.

The metal supporting board 2 has a thickness of, for example, 10 μm or more, preferably 15 μm or more, and for example, 50 μm or less, preferably 30 μm or less.

The insulating base layer 3 is disposed at one side in the thickness direction of the metal supporting board 2. The insulating base layer 3 has a substantially flat plate (sheet) shape extending in surface direction. The insulating base layer 3 has a pattern corresponding to the conductor layer 4 to be described later. A portion of the other side in the thickness direction of the insulating base layer 3 is exposed downward from the above-described opening 22, and supports the terminal portion 23. The insulating base layer 3 is composed of, for example, an insulating material such as polyimide. The thickness of the insulating base layer 3 is suitably set in accordance with purpose and use.

The conductor layer 4 is disposed at the other side in the thickness direction of the insulating base layer 3. The conductor layer 4 continuously has a conductor wire (not shown) and a conductor terminal 9 that is continuous there from. The conductor terminal 9 is electrically connected with a slider (not shown). Connection between the conductor terminal 9 and the slider (not shown) is described, for example, in Japanese Unexamined Patent Publication No. 2017-162540, Japanese Unexamined Patent Publication No. 2016-103305, Japanese Unexamined Patent Publication No. 2016-018576, and Japanese Unexamined Patent Publication No. 2016-009514.

Examples of the material of the conductor layer 4 include copper, nickel, and alloys thereof. The conductor layer 4 has a thickness of, for example, 3 μm or more, preferably 5 μm or more, and for example, 50 μm or less, preferably 20 μm or less.

The insulating cover layer (not shown) is the uppermost layer of the suspension board with circuit 1. The insulating cover layer (not shown) allows the conductor terminal 9 to expose, and has a pattern that covers the conductor wire (not shown).

The gold plate layer 5 is disposed so as to be a thin film, so that it faces both of the other side in the thickness direction and the side face of the terminal portion 23 (including the surrounding face), with an adherence layer 6 to be described later interposed therebetween. That is, the gold plate layer 5 is disposed indirectly at the other side in the thickness direction and the surrounding face of the terminal portion 23.

The gold plate layer 5 has a thickness of, for example, 10 μm or more, preferably 50 nm or more, and for example, 2000 nm or less, preferably 1000 nm or less.

The adherence layer 6 is disposed between the terminal portion 23 and the gold plate layer 5. To be specific, the adherence layer 6 is an interlayer that is interposed between the other side in the thickness direction and the surrounding face of the terminal portion 23, and one side in the thickness direction and the inner side of the gold plate layer 5. The adherence layer 6 is a thin film along both the other side in the thickness direction and the surrounding faces of the terminal portion 23.

In the adherence layer 6, gold and the metal contained in the corrosion resistant alloy are mixedly present.

Gold is derived from the gold of the material of the above-described gold plate layer 5.

The corrosion resistant alloy is derived from the material of the above-described metal supporting board 2, and the metal contained in the corrosion resistant alloy include chromium, nickel, and molybdenum. Preferably, chromium is used. When the metal contained in the corrosion resistant alloy is chromium, the metal is mixedly present with gold in the adherence layer 6 (described later), which improves anticorrosion of the adherence layer 6, and improves durability of the suspension board with circuit 1.

To be specific, the adherence layer 6 includes a first layer 7 adjacent to the terminal portion 23, and a second layer 8 adjacent to the gold plate layer 5. To be specific, the adherence layer 6 includes, from the terminal portion 23 to the gold plate layer 5, the first layer 7 and the second layer 8 in sequence. The adherence layer 6 is preferably composed only of the first layer 7 and the second layer 8.

The first layer 7 is a thin film that is in contact with (conform to) the other side in the thickness direction and the surrounding face of the terminal portion 23. The second layer 8 is a thin film that is in contact with (conform to) one side in the direction facing from the terminal portion 23 to the gold plate layer 5 in the first layer 7, that is, the face opposite to the face that is in contact with the terminal portion 23 in the first layer 7.

For the material of the first layer 7 and the second layer 8, an alloy containing at least iron, gold, and metal (excluding gold) is used.

The material of the first layer 7 is, a second alloy containing, for example, a comparatively large amount of gold, and to be specific, the percentage of gold atom in the second alloy is higher than the percentage of metal atom in the second alloy. In the second alloy, ratio of the percentage of metal atom relative to the percentage of gold atom (percentage of gold atom/percentage of metal atom) is, for example, more than 1, preferably 1.1 or more, more preferably 1.2 or more, even more preferably 1.3 or more, particularly preferably 1.35 or more, and for example, 5 or less. To be specific, the percentage of gold atom in the second alloy is, for example, 10 atomic % or more, preferably 15 atomic % or more, more preferably 20 atomic % or more, and for example, 40 atomic % or less. The percentage of metal atom in the second alloy is, for example, 5 atomic % or more, preferably 10 atomic % or more, more preferably 15 atomic % or more, and for example, 25 atomic % or less, preferably less than 20 atomic %.

The material of the second layer 8 is a second alloy that contains comparatively small amount of gold, and contains a comparatively large amount of the above-described metal excluding gold, and to be specific, the percentage of gold atom in the second alloy is lower than the percentage of metal atom in the second alloy. In the second alloy, the percentage of metal atom relative to the percentage of gold atom (percentage of gold atom/percentage of metal atom) is, for example, less than 1, preferably 0.99 or less, more preferably 0.9 or less, even more preferably 0.8 or less, particularly preferably 0.7 or less, and for example, 0.2 or more. To be specific, the percentage of gold atom in the second alloy is, for example, 5 atomic % or more, preferably 10 atomic % or more, and for example, 25 atomic % or less, preferably 20 atomic % or less, more preferably less than 20 atomic %. The percentage of metal atom in the second alloy is, for example, 10 atomic % or more, preferably 15 atomic % or more, more preferably 20 atomic % or more, and for example, 40 atomic % or less.

The first layer 7 has a thickness of, for example, 0.5 nm or more, preferably 1 nm or more, and for example, 20 nm or less, preferably 10 nm or less.

The second layer 8 has a thickness of, for example, 0.5 nm or more, preferably 1 nm or more, and for example, 20 nm or less, preferably 10 nm or less.

The adherence layer 6 has a thickness T of, for example, a total of the first layer 7 thickness and the second layer 8 thickness, and for example, 2 nm or more, preferably 3 nm or more, and for example, 40 nm or less, preferably 20 nm or less.

The ratio of the thickness T of the adherence layer 6 relative to the thickness of the gold plate layer 5 (adherence layer 6 thickness T/gold plate layer 5 thickness) is, for example, 0.1 or more, preferably 0.5 or more, and for example, 3 or less, preferably 2 or less.

When the thickness T of the adherence layer 6 is the above-described lower limit or more, adherence between the gold plate layer 5 and the terminal portion 23 can be sufficiently improved.

When the adherence layer 6 has a thickness T of the above-described upper limit or less, the thickness of the gold plate layer 5 can be sufficiently ensured, and excellent continuity based on the gold plate layer 5 can be ensured.

The presence of the adherence layer 6, the presence of the first layer 7 and the second layer 8, and their thicknesses (including thickness T of adherence layer 6) are specified and measured by, for example, observation of cross sectional images of TEM.

Next, description is given below of a method for producing a suspension board with circuit 1.

The method for producing a suspension board with circuit 1 includes a first step (ref: FIG. 1A), in which the suspension board with circuit 1 including a metal supporting board 2, an insulating base layer 3, a conductor layer 4, and an insulating cover layer (not shown) is prepared; a second step (ref: FIG. 1B) in which a gold plate layer 5 is disposed; and a third step, in which an adherence layer 6 is formed (ref: FIG. 1C).

As shown in FIG. 1A, in the first step, the suspension board with circuit 1 including the metal supporting board 2, insulating base layer 3, conductor layer 4, and insulating cover layer (not shown) is prepared. This suspension board with circuit 1 is in the middle of production, and neither of the gold plate layer 5 nor adherence layer 6 is disposed (formed) at the terminal portion 23.

As shown in FIG. 1B, then, in the second step, the gold plate layer 5 is formed at the other side in the thickness direction and the surrounding face of the terminal portion 23.

The gold plate layer 5 is formed at the other side in the thickness direction and surrounding face of the terminal portion 23 by gold plating, in which the suspension board with circuit 1 in the process of production is immersed in a gold plating solution. Examples of the gold plating include electrolytic gold plating and electroless gold plating, and preferably, electrolytic gold plating is used.

The above-described gold plating can be performed a single time or a plurality of times.

When gold plating is performed a plurality of times, for example, using a different types of gold plating solutions, further as necessary, plating conditions such as the electric current density and application time are suitably changed. To be specific, strike gold plating and soft gold plating can be performed in sequence (that is, performance of two gold plating). In strike gold plating, the terminal portion 23 is allowed to contact with a first gold plating solution containing no strong acid (for example, inorganic acid) and containing weak acid (for example, organic acid) and a gold compound (for example, gold precursor such as gold potassium cyanide). In soft gold plating, contains no acid (for example, the above-described strong acid, weak acid) but contains a gold compound (for example, the above-described gold precursor). The electric current density in the strike gold plating is higher than the electric current density in the soft gold plating, and for example, the ratio of the electric current density in strike gold plating relative to the electric current density in soft gold plating is 2 or more.

In this manner, the gold plate layer 5 is formed to be a thin film at the other side in the thickness direction and surrounding face of the terminal portion 23.

Even when the gold plating is performed a plurality of times, the plurality of layers corresponding to the plurality of gold plating of the gold plate layer 5 are all composed of gold, and therefore no interface is formed (observed) therebetween, and therefore, they constitute a single layer.

The gold plate layer 5 in the second step has a thickness larger than the gold plate layer 5 after the third step.

As shown in FIG. 1C, in the third step, the adherence layer 6 is formed.

To form the adherence layer 6, the terminal portion 23 and gold plate layer 5 are heated. To be specific, the suspension board with circuit 1 in the process of production including the gold plate layer 5 is put in a heating furnace 15.

The heating temperature is, for example, 100° C. or more, preferably 150'C or more, more preferably 200° C. or more, and 400° C. or less, preferably 350° C. or less. The heating temperature is a temperature set in the heating furnace 15, and the terminal portion 23 and the gold plate layer 5 are both thin, and therefore substantially, they are heated to the above-described temperature set.

When the heating temperature is the above-described lower limit or more, the adherence layer 6 with a sufficient thickness T can be formed. When the heating temperature is the above-described upper limit or less, deterioration of the insulating base layer 3 and the insulating cover layer (not shown) (damages, etc.) can be suppressed.

The heating time is not particularly limited, as long as the terminal portion 23 and the gold plate layer 5 reach the above-described set temperature, and it allows for the formation of the adherence layer 6. For example, the heating time is 1 minute or more, preferably 5 minutes or more, more preferably 10 minutes or more, further preferably 20 minutes or more, particularly preferably 30 minutes or more, and for example, 2 hours or less, preferably 1 hour or less.

In the third step, by heating the above-described terminal portion 23 and the gold plate layer 5, the interface between the terminal portion 23 and the gold plate layer 5 becomes the adherence layer (mixedly present layer) 6, in which metals (preferably, chromium) (excluding gold) of materials of the terminal portion 23, i.e., corrosion resistant alloy, is mixedly present (that is, metals and gold are mixed) with gold, i.e., the material of the gold plate layer 5.

To be specific, by heating, the metals progress (move) (migration) from the surface of the terminal portion 23 (thickness T of the adherence layer 6) to the inside of the gold plate layer 5, while gold progresses (modes) (migration) from the surface of the gold plate layer 5 (contact face to the terminal portion 23) to the inside of the terminal portion 23. In this manner, the adherence layer 6 in which the above-described metal and gold are mixedly present (they are both present in a mixed state) is formed.

In particular, in the adherence layer 6, the portion adjacent to the terminal portion 23 has a high concentration of gold, and the above-described first layer 7 is formed. Meanwhile, the portion adjacent to the gold plate layer 5 has a high concentration of metals (excluding gold), and the above-described second layer 8 is formed.

The gold and metals are all present (mixedly present) in both of the first layer 7 and the second layer 8.

The first layer 7 has a high gold concentration, and the second layer 8 has a low gold concentration. Therefore, the adherence layer 6 has a gold concentration gradient, where the gold concentration in the first layer 7 is higher than the gold concentration in the second layer 8.

Meanwhile, the second layer 8 has a high metals concentration than the metals concentration in the first layer 7. Therefore, the adherence layer 6 has a metal concentration gradient, where the metal concentration in the second layer 8 is higher than the metal concentration in the first layer 7.

In this manner, the suspension board with circuit 1 including the metal supporting board 2, insulating layer 3 as an example of the insulating base layer, conductor layer 4, insulating cover layer (not shown), gold plate layer 5, and adherence layer 6 (first layer 7 and second layer 8) is produced.

Thereafter, for example, terminals (not shown) of the light source are disposed at the other side in the thickness direction of the terminal portion 23 and gold plate layer 5 so as to face them, and the terminals (not shown) are allowed to contact the gold plate layer 5 to electrically connect the terminals (not shown) and the terminal portion 23 through the gold plate layer 5 and the adherence layer 6. Thereafter, as necessary, the terminals (not shown) (probe, etc.) can be separated from the gold plate layer 5. For such connection, for example, alloys such as solder, and connection member such as an anisotropic conductive resin composition are used.

In the suspension board with circuit 1, in the adherence layer 6, gold and metals contained in the corrosion resistant alloy are mixedly present. Therefore, the adherence layer 6 has excellent anticorrosion.

The above-described adherence layer 6 is disposed between the terminal portion 23 and the gold plate layer 5, and therefore the adherence layer 6 can improve adherence between the terminal portion 23 and the gold plate layer 5.

As a result, the suspension board with circuit 1 has excellent durability.

With the method for producing a suspension board with circuit 1, by heating the terminal portion 23 and the gold plate layer 5, the adherence layer 6 in which gold and metals (excluding gold) are mixedly present can be formed, and therefore the adherence layer 6 with excellent anticorrosion properties and that improves adherence between the terminal portion 23 and the gold plate layer 5 can be easily formed.

Modified Example

In the following, the members corresponding to the above-described elements and steps are designated with the same reference numerals, and detailed descriptions thereof are omitted. The modified examples also have the same operations and effects as those of the embodiment unless otherwise specified. The embodiment can be combined with the modified example suitably.

As shown in the enlarged view in FIG. 1C, in the embodiment, the interface between the adherence layer 6 (first layer 7) and the terminal portion 23 (metal supporting board 2), the interface between the adherence layer 6 (second layer 8) and the gold plate layer 5, and the interface between the first layer 7 and the second layer 8 are clearly shown, but the present invention also includes the case where these interfaces are unclear.

As shown in FIG. 1C, in the embodiment, the gold plate layer 5 and the adherence layer 6 are disposed only at the terminal portion 23, but for example, the gold plate layer 5 and the adherence layer 6 can be disposed at both of the terminal portion 23 and the main body portion 21, although not shown. Alternatively, the gold plate layer 5 and the adherence layer 6 can be disposed only at the main body portion 21, without disposing them at the terminal portion 23.

Preferably, the gold plate layer 5 and the adherence layer 6 are disposed at least at the terminal portion 23. When the gold plate layer 5 and the adherence layer 6 are disposed at the terminal portion 23, even if they are connected with the light source terminals, excellent durability and anticorrosion at the terminal portion 23 can be achieved.

As shown in FIG. 1C, in the embodiment, the gold plate layer 5 and the adherence layer 6 are disposed at both of the other side in the thickness direction (lower face in the figure) and the side face (surrounding face) of the terminal portion 23, but for example, although not shown, they can be disposed at only the other side in the thickness direction of the terminal portion 23, without disposing at the side face of the terminal portion 23.

The metal supporting board 2 can include a passive film (not shown) provided at the surface layer. To be specific, the terminal portion 23 of the suspension board with circuit 1 in the process of production prepared in the first step and shown in FIG. 1A includes the passive film disposed at the outermost layer of the other side in the thickness direction and side face thereof, and the passive film is removed, for example, in strike plating in the second step shown in FIG. 1B. Alternatively, the passive film can be allowed to be present without being removed in the second step.

Furthermore, although not shown, the adherence layer 6 can include a third layer containing the gold and metals at the same atom percentage between the first layer 7 and the second layer 8.

In the embodiment, the suspension board with circuit 1 is given as an example of the wired circuit board of the present invention, but it is not limited thereto. For example, the wired circuit board of the present invention can be applied to other wired circuit boards, for example, a flexible wired circuit board including the metal supporting board 2 as a reinforcing layer.

EXAMPLES

Next, the present invention is further described based on Examples below. The present invention is however not limited by the following Examples. The specific numerical values in mixing ratios (content ratios), physical property values, and parameters used in the following description can be replaced with upper limit values (numerical values defined with "or less" or "below") or lower limit values (numerical values defined with "or more" or "above") of corresponding numerical values in mixing ratios (content ratios), physical property values, and parameters described in the above-described "DETAILED DESCRIPTION OF THE INVENTION".

Example 1

As shown in FIG. 1A, the first step was performed to prepare a suspension board with circuit 1. To be specific, in the first step, as shown in FIG. 1A, the suspension board with circuit 1 was prepared: the suspension board with circuit 1 included a metal supporting board 2 having a terminal portion 23, an insulating base layer 3 disposed at one side in the thickness direction of the metal supporting board 2, a conductor layer 4 disposed at one side in the thickness direction of the insulating base layer 3 and having a conductor terminal 9, and an insulating cover layer (not shown) allowing the conductor terminal 9 to expose at one side in the thickness direction of the insulating base layer 3.

The metal supporting board 2 (including terminal portion 23) was composed of SUS304 (austenite stainless steel, chromium concentration: 18 mass %, nickel concentration: 8 mass %), and its thickness was 25 μm. The insulating base layer 23 was composed of polyimide, and its thickness was 10 μm. The conductor layer 24 (conductor terminal 28) was composed of copper, and its thickness was 20 μm. The insulating cover layer was composed of polyimide.

Then, as shown in FIG. 1B, by gold plating, a gold plate layer 5 having a thickness of 200 nm was formed at the other side in the thickness direction and surrounding face of the terminal portion 23.

Thereafter, as shown in FIG. 1C, the suspension board with circuit 1 in which the gold plate layer 5 was formed was put in a heating furnace, and the suspension board with circuit 1 was heated under conditions described in Table 1.

In this manner, the adherence layer 6 interposed between the terminal portion 23 and the gold plate layer 5 was formed.

The adherence layer 6 and its thickness were confirmed and measured by observation of cross sectional TEM image.

As a result, the adherence layer 6 included a first layer 7 having a chromium atom percentage of 22 atomic % and a percentage of gold atom of 16 atomic %, and a second layer 8 having a chromium atom percentage of 16 atomic % and a percentage of gold atom of 23 atomic % sequentially from the terminal portion 23 to the gold plate layer 5, wherein the adherence layer 6 had a thickness of 100 nm.

In the second alloy of the first layer 7, the chromium atom percentage relative to the percentage of gold atom (chromium atom percentage/percentage of gold atom) was 1.38 (=22/16), and in the second alloy of the second layer 8, the chromium atom percentage relative to the percentage of gold atom was 0.69 (=16/23).

Example 2 to Example 17

As shown in FIG. 1A, the suspension board with circuit 1 was prepared in the same manner as in Example 1, except that the heating conditions in the third step were changed. The adherence layer 6 was confirmed with observation of cross sectional TEM images.

Comparative Example 1

The suspension board with circuit 1 was prepared in the same manner as in Example 1, except that the third step was not performed.

The suspension board with circuit 1 had no adherence layer 6 between the terminal portion 23 and the gold plate layer 5.

Comparative Example 2

The suspension board with circuit 1 was prepared in the same manner as in Example 1, except that the sequence of the steps in the production method was changed to the sequence of the first step, third step, and second step; in the third step, the suspension board with circuit 1 was not heated and a copper layer having a thickness 70 nm was formed as the adherence layer 6 by sputtering at the other side in the thickness direction and surrounding face of the terminal portion 23; and in the second step, the gold plate layer 5 was formed on the surface of the adherence layer 6.

[Evaluation]

Evaluations were conducted for the suspension board with circuit 1 of Examples and Comparative Examples. The results are shown in Table 1.

<Corrosion Properties Test>

The suspension board with circuit 1 of Examples and Comparative Examples was allowed to stand under conditions of 85° C. and 85% RH for 500 hours, and then the adherence layer 6 (in Comparative Example 1, the interface between the terminal portion 23 and the gold plate layer 5) was observed with an optical microscope, and Corrosion properties of the adherence layer 6 were evaluated.

(Criteria of Corrosion Properties)

Good: no corrosion was observed in the adherence layer 6.

Bad: corrosion was observed in the adherence layer 6.

<Adherence Test>

The suspension boards with circuit 1 were prepared, 20 each for Examples and Comparative Examples.

A peeling test was performed, in which ultrasonic vibration of the conditions below was applied to the suspension board with circuit 1. Of the 20 suspension boards with circuit 1, percentage (%) of peeling occurrence of the gold plate layer 5 was determined.

(Ultrasonic Vibration Conditions)

| Frequency | 68 kHz |
| Output | 197 W |
| Water temperature | 50° C. |
| Water amount | 18.6 L |
| Time | 10 minutes |

TABLE 1

| | Adherence layer material | Heating conditions in third step ° C. | Heating conditions in third step Min | Evaluation Corrosion properties test | Evaluation Adherence test (Peeling percentage (%)) |
|---|---|---|---|---|---|
| Example 1 | Chromium and gold | 350 | 120 | Good | 0 |
| Example 2 | Chromium and gold | 350 | 60 | Good | 0 |
| Example 3 | Chromium and gold | 350 | 30 | Good | 0 |
| Example 4 | Chromium and gold | 350 | 5 | Good | 10 |
| Example 5 | Chromium and gold | 350 | 1 | Good | 0 |
| Example 6 | Chromium and gold | 250 | 60 | Good | 0 |
| Example 7 | Chromium and gold | 250 | 30 | Good | 30 |
| Example 8 | Chromium and gold | 250 | 5 | Good | 20 |
| Example 9 | Chromium and gold | 250 | 1 | Good | 30 |
| Example 10 | Chromium and gold | 200 | 60 | Good | 40 |
| Example 11 | Chromium and gold | 200 | 30 | Good | 40 |
| Example 12 | Chromium and gold | 200 | 5 | Good | 30 |
| Example 13 | Chromium and gold | 200 | 1 | Good | 45 |
| Example 14 | Chromium and gold | 100 | 60 | Good | 50 |
| Example 15 | Chromium and gold | 100 | 30 | Good | 70 |
| Example 16 | Chromium and gold | 100 | 5 | Good | 50 |
| Example 17 | Chromium and gold | 100 | 1 | Good | 60 |
| Comp. Ex. 1[X.1] | — | No heating | | Good | 90 |
| Comp. Ex. 2 | Copper | No heating | | Bad | 80 |

[X.1]: No adherence layer in comparative example 1.

While the illustrative embodiments of the present invention are provided in the above description, such is for illustrative purpose only and it is not to be construed restrictively. Modification and variation of the present invention that will be obvious to those skilled in the art is to be covered by the following claims.

INDUSTRIAL APPLICABILITY

The wired circuit board of the present invention is used, for example, as a suspension board with circuit.

DESCRIPTION OF REFERENCE NUMERALS 1 suspension board with circuit
2 metal supporting board 3 insulating base layer
4 conductor layer
5 gold plate layer
6 adherence layer
7 first layer
8 second layer
23 terminal portion
T thickness of adherence layer

The invention claimed is:

1. A wired circuit board comprising:

a metal supporting board, an insulating layer disposed at one side in the thickness direction of the metal supporting board, a conductor layer disposed at one side in the thickness direction of the insulating layer, a gold plate layer disposed at the other side in the thickness direction of the metal supporting board, and an adherence layer disposed between the metal supporting board and the gold plate layer, wherein the material of the metal supporting board is a corrosion resistant alloy, in the adherence layer, gold and the metals contained in the corrosion resistant alloy are mixedly present, the adherence layer includes a first layer adjacent to the metal supporting board, and a second layer adjacent to the gold plate layer, in the first layer, the percentage of gold atom is higher than the percentage of metal atom, and in the second layer, the percentage of gold atom is lower than the percentage of metal atom.

2. The wired circuit board according to claim 1, wherein the adherence layer has a thickness of 2 nm or more.

3. The wired circuit board according to claim 1, wherein the corrosion resistant alloy is stainless steel, and the metal is chromium.

4. The wired circuit board according to claim 1, wherein the metal supporting board includes a terminal portion, and the adherence layer and the gold plate layer are disposed in sequence at the other side in the thickness direction of the terminal portion.

5. The wired circuit board according to claim 1, being a suspension board with circuit.

6. The wired circuit board according to claim 1, wherein the adherence layer has a gold concentration gradient and a metal concentration gradient.

* * * * *